United States Patent
Jin

(10) Patent No.: US 11,870,244 B2
(45) Date of Patent: Jan. 9, 2024

(54) COMMON-MODE TRANSIENT IMMUNITY (CMTI) CIRCUIT AND METHOD OF OPERATION THEREFOR

(71) Applicant: SEMICONDUCTOR COMPONENTS INDUSTRIES, LLC, Phoenix, AZ (US)

(72) Inventor: Wookang Jin, Bucheon (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 585 days.

(21) Appl. No.: 16/948,786

(22) Filed: Oct. 1, 2020

(65) Prior Publication Data
US 2022/0014016 A1    Jan. 13, 2022

Related U.S. Application Data

(60) Provisional application No. 62/705,665, filed on Jul. 9, 2020.

(51) Int. Cl.
*H02H 9/00* (2006.01)
*H03B 5/12* (2006.01)
*H02H 1/00* (2006.01)

(52) U.S. Cl.
CPC .......... *H02H 9/005* (2013.01); *H02H 1/0007* (2013.01); *H03B 5/1212* (2013.01); *H03B 5/1228* (2013.01)

(58) Field of Classification Search
CPC ............................ H04L 25/0266; H02H 9/005
See application file for complete search history.

(56) References Cited

U.S. PATENT DOCUMENTS

| | | | |
|---|---|---|---|
| 10,785,064 B1* | 9/2020 | Chen | H04L 25/0266 |
| 2017/0005580 A1* | 1/2017 | Morroni | H02M 3/33592 |
| 2017/0201399 A1* | 7/2017 | Adinarayana | H04B 1/0475 |

OTHER PUBLICATIONS

S. Sankaran et al., "An efficient and resilient ultra-high speed galvanic data isolator leveraging broad-band multi resonant tank electro-magnetic coupling," 2015 Symposium on VLSI Circuits (VLSI Circuits), Kyoto, 2015, pp. C210-C211, doi: 10.1109/VLSIC.2015.7231261.

* cited by examiner

*Primary Examiner* — Jared Fureman
*Assistant Examiner* — Christopher J Clark
(74) *Attorney, Agent, or Firm* — Brake Hughes Bellermann LLP

(57) ABSTRACT

A CMTI circuit includes a first detector that receives one or more output signals from an oscillator and a first enable signal and generates a first detection signal when the received output signals are determined to be substantially not oscillating at a first time. The CMTI circuit further includes a first activation signal generator that generates a first activation signal in response to the first detection signal to resume oscillation of the output signals.

20 Claims, 7 Drawing Sheets

COMMON-MODE TRANSIENT IMMUNITY (CMTI) CIRCUIT AND METHOD OF OPERATION THEREFOR

CROSS-REFERENCE TO RELATED APPLICATIONS

This application claims the benefit of U.S. Provisional Patent Application No. 62/705,665, filed on Jul. 9, 2020, the entire contents of which is incorporated herein by reference.

BACKGROUND

The present disclosure relates to a common-mode transient immunity (CMTI) circuit, a system including the CMTI circuit, and a method for controlling the system.

Galvanic isolation may be used to isolate two or more electric circuits to prevent current flow therebetween, whereas the electric circuits need to communicate to transfer power, data, or both by other means. The circuits may be coupled to different ground voltages, and a relatively rapid shift in one of the ground voltages may change a voltage across one or more parasitic capacitors between the isolated circuits to inject a common mode current. The injected current may produce data transmission errors, and thus deteriorate data transmission characteristics between the electric circuits. Common-mode transient immunity (CMTI) may define the maximum voltage slew rate that a system including the isolated circuits can withstand. Accordingly, a system including the isolated electric circuits is desirable to achieve good CMTI performance.

SUMMARY

Embodiments of the present application relate to a common-mode transient immunity (CMTI) circuit, a system including the CMTI circuit, and a method for controlling the system.

In an embodiment, a CMTI circuit includes a first detector that receives one or more output signals from an oscillator and a first enable signal and generates a first detection signal when the received output signals are determined to be substantially not oscillating at a first time, and a first activation signal generator that generates a first activation signal in response to the first detection signal to resume oscillation of the output signals.

In an embodiment, a system including the CMTI circuit includes a transmitter that modulates a data input signal using an oscillator to generate one or more output signals, the transmitter including a first bleeder circuit that generates a first detection signal in response to a first enable signal when the output signals are determined to be substantially not oscillating at a first time and generates a first activation signal in response to the first detection signal to resume oscillation of the output signals. The system further includes a galvanic isolator that transfers the output signals from the transmitter and a receiver that generates a data output signal in response to the transferred output signals.

In an embodiment, a method for controlling the system includes modulating a data input signal using an oscillator to generate one or more output signals, generating a first detection signal in response to a first enable signal when the output signals are determined to be substantially not oscillating at a first time, and generating a first activation signal in response to the first detection signal to resume oscillation of the output signals.

DETAILED DESCRIPTION

Figure 1:
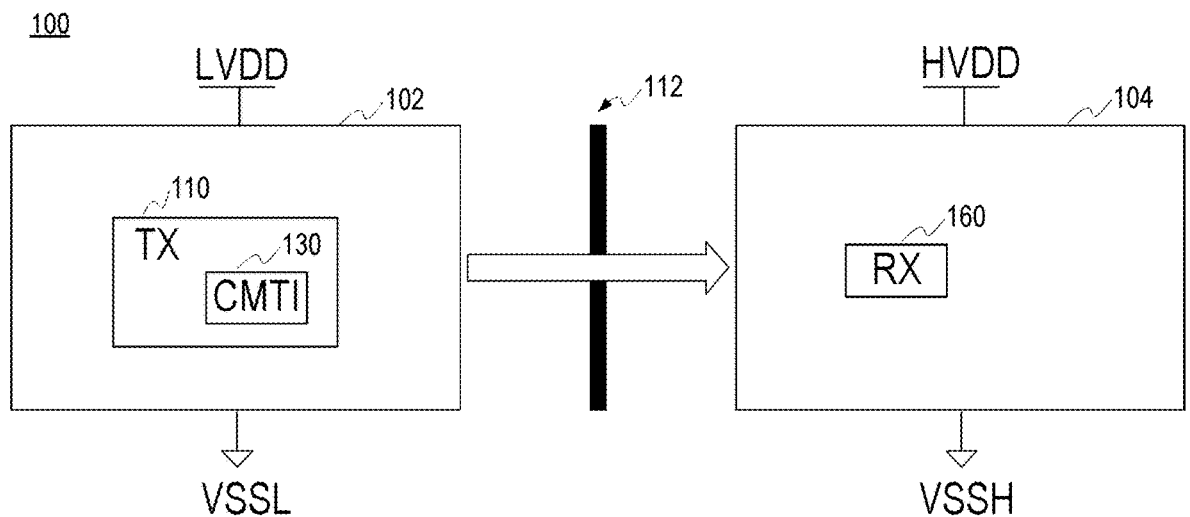
FIG. 1 illustrates a system according to an embodiment of the present disclosure.

Embodiments of the present application relate to a common-mode transient immunity (CMTI) circuit, a system including the CMTI circuit, and a method for controlling the system.

In an embodiment, a CMTI circuit includes a first bleeder circuit and a second bleeder circuit. When a shift in a ground voltage leads to injection of a current into an oscillator to stop oscillation, the first bleeder circuit increases a tail current of the oscillator to resume the oscillation. When the increased magnitude of the tail current of the oscillator using the first bleeder circuit is not sufficient to keep the resumed oscillation, the second bleeder circuit further increases the tail current of the oscillator. As a result, the CMTI circuit including the first and second bleeder circuits may achieve robust CMTI characteristics to withstand one or more of a high peak voltage, a high maximum voltage slew rate, and a long time interval of the shift in the ground voltage.

In an embodiment, the CMTI circuit may not operate the second bleeder circuit when the increased magnitude of the tail current of the oscillator is sufficient to keep the resumed oscillation by using the first bleeder circuit. When the CMTI circuit needs to operate the first and second bleeder circuits, the CMTI circuit operates the second bleeder circuit after the first bleeder circuit operates during a time interval that is shorter than that of the first bleeder circuit. As a result, the CMTI circuit may minimize usage of the second bleeder circuit to reduce power consumption.

In an embodiment, the CMTI circuit prevents an occurrence of a glitch in a data output signal from a receiver using the first bleeder circuit and the second bleeder circuit, rather than using a delay filter to remove a glitch in the data output signal. Accordingly, a transceiver including the CMTI circuit according to an embodiment may reduce a propagation delay compared to a conventional transceiver including the delay filter, thereby increasing a data transfer rate.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

FIG. 1 illustrates a system 100 according to an embodiment of the present disclosure. The system 100 includes a first chip 102, a galvanic isolator 112, and a second chip 104.

The first chip 102 is coupled to a first supply voltage (e.g., a low supply voltage) LVDD and a first ground voltage (e.g., a low ground voltage) VSSL, and thus is associated with a first power domain (e.g., a low voltage domain). In an embodiment, the first chip 102 may include a transmitter (TX) 110 that includes a CMTI circuit 130.

The second chip 104 is coupled to a second supply voltage (e.g., a high supply voltage) HVDD and a second ground voltage (e.g., a high ground voltage) VSSH, and thus is associated with a second power domain (e.g., a high voltage domain). In an embodiment, the second chip 104 may include a receiver (RX) 160.

A galvanic isolator 112 couples the first chip 102 and the second chip 104 to transfer power, or data, or both, between the first chip 102 and the second chip 104. The galvanic isolator 112 further addresses issues related to electromagnetic interference (EMI) and grounds having different potentials. For example, the galvanic isolator 112 may be any one of an inductive isolator, a capacitive isolator, and an opto-isolator.

In an embodiment, the system 100 is a data communication system including a galvanic isolator. For example, the first chip 102 may include one or more of bus/network controllers, microcontrollers, and human/data interfaces, and the second chip 104 may include one or more of sensor interfaces, medical equipment, and communication network devices.

In an embodiment, the system 100 is a power system that functions as a gate driver. For example, the first chip 102 may receive a pulse width modulation (PWM) signal and include the transmitter 110 modulating the received signal based on a specific modulation scheme (e.g., On-Off keying), the galvanic isolator 112 may transfer the modulated signal, and the second chip 104 may include the receiver 160 demodulating the transferred signal to recover the PWM signal and outputting the recovered PWM signal to control one or more switching devices.

Figure 2:
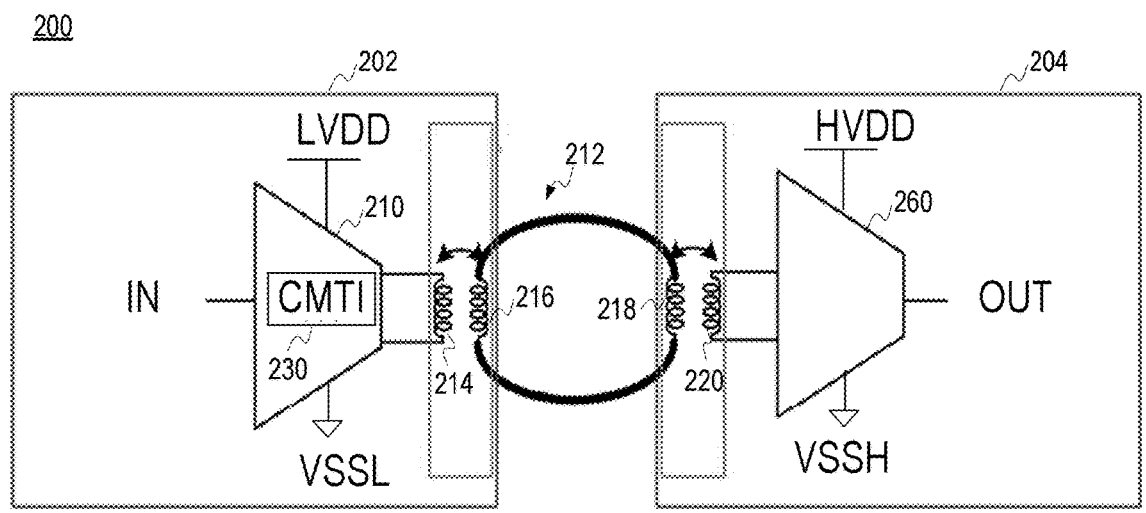
FIG. 2 illustrates a system suitable for use as the system in FIG. 1 according to an embodiment of the present disclosure.

FIG. 2 illustrates a system 200 according to an embodiment of the present disclosure. In the embodiment shown in FIG. 2, the system 200 includes a first chip 202, an inductive galvanic isolator 212, and a second chip 204, and the first chip 202 and the second chip 204 include a transmitter 210 and a receiver 260, respectively.

The transmitter 210 is coupled to a first supply voltage (e.g., a low supply voltage) LVDD and a first ground voltage (e.g., a low ground voltage) VSSL and includes a CMTI circuit 230. The transmitter 210 receives a data input signal IN and modulates the data input signal IN based on a specific scheme (e.g., On-Off keying) to generate one or more output signals. The CMTI circuit 230 determines whether the transmitter 210 substantially has stopped modulation of the data input signal IN in response to the output signals, and generates one or more activation signals to resume the modulation when it determines that the transmitter 210 has substantially stopped the modulation.

The inductive galvanic isolator 212 includes a first winding 216 and a second winding 218. In an embodiment, a first inductor 214 of the transmitter 210, the first and second windings 216 and 218 of the inductive galvanic isolator 212, and a second inductor 220 of the receiver 260 may be fabricated using semiconductor manufacturing processes, thereby implementing a coreless transformer. For example, the first inductor 214 and the first winding 216 may be integrated in the first chip 202 including the transmitter 210, and the second inductor 220 and the second winding 218 may be integrated in the second chip 204 including the receiver 260. Because a space between the first inductor 214 of the transmitter 210 and the first winding 216 of the inductive isolator 212 functions as a first isolation barrier and a space between the second winding 218 of the inductive isolator 212 and the second inductor 220 of the receiver 260 function as a second isolation barrier, the inductive galvanic isolator 212 may provide high-level isolation between the transmitter 210 and the receiver 260. In addition, when a common-mode transient (CMT) event (e.g., a shift in a ground voltage VSSH) causes an injection current (e.g., a current Icp in FIG. 3) into the transmitter 210 flowing through a current path, the current path includes two parasitic capacitors (e.g., parasitic capacitors Cp in FIG. 3) coupled in series to reduce the total capacitance value of the coupled parasitic capacitors, thereby reducing the magnitude of the injection current that is proportional to the capacitance value. However, embodiments of the present disclosure are not limited thereto. For example, the entire coreless transformer may be integrated in the first chip 202 including the transmitter 210 to simplify the fabrication processes of the transformer.

The receiver 260 receives data transferred across the inductive galvanic isolator 212 to generate a data output signal OUT in response to the received data. The receiver 260 is coupled to a second supply voltage (e.g., a high supply voltage) HVDD and a second ground voltage (e.g., a high ground voltage) VSSH.

Figure 3:
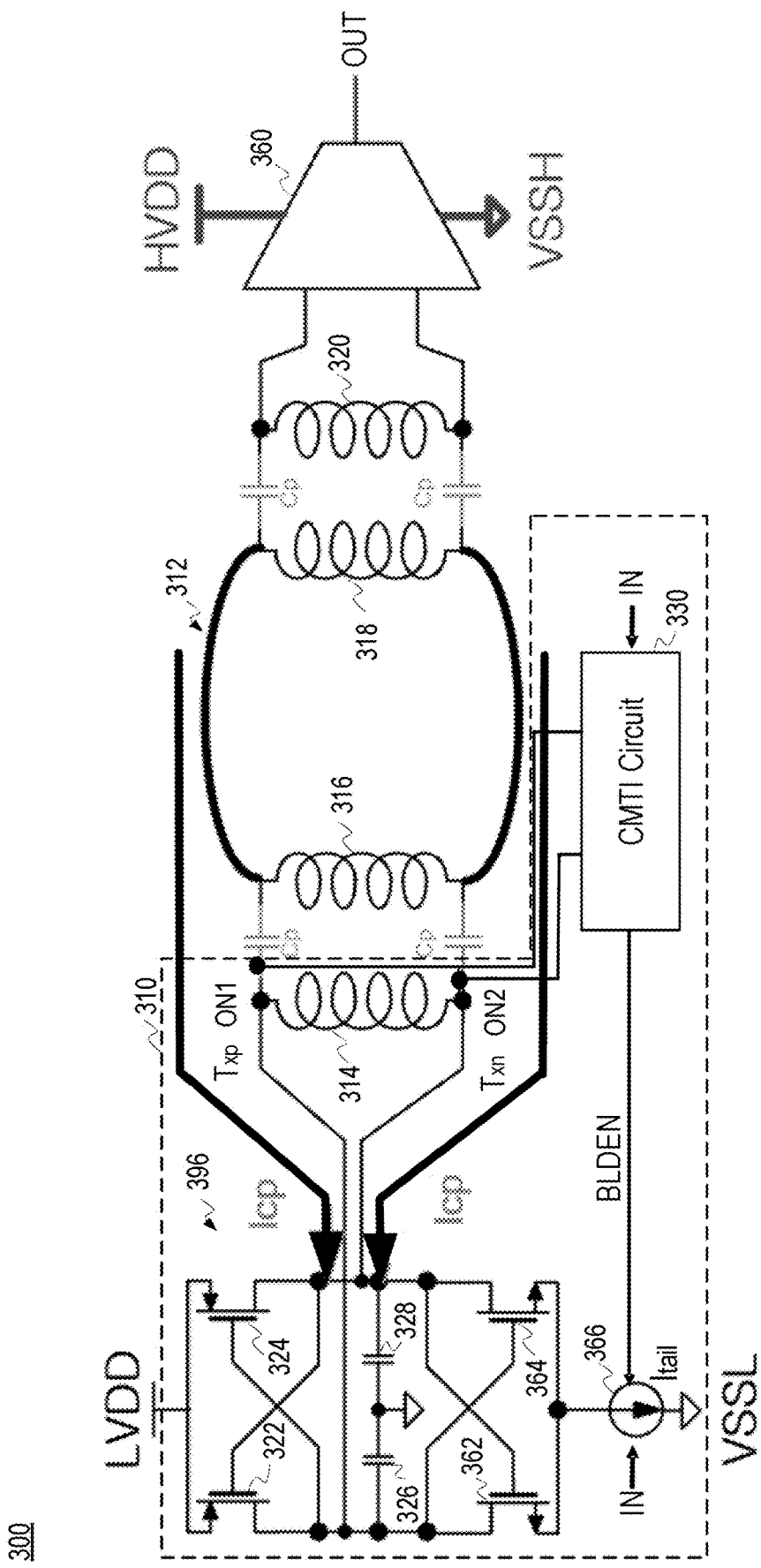
FIG. 3 illustrates a system suitable for used as the system in FIG. 2 according to an embodiment of the present disclosure.

FIG. 3 illustrates a system 300 according to an embodiment of the present disclosure. In the embodiment shown in FIG. 3, the system 300 includes a transmitter 310, an inductive galvanic isolator 312, and a receiver 360.

The transmitter 310 is coupled to a first supply voltage (e.g., a low supply voltage) LVDD and a first ground voltage (e.g., a low ground voltage) VSSL and includes an oscillator 396 and a CMTI circuit 330. In an embodiment, as shown in FIG. 3, the oscillator 396 is a cross-coupled differential LC oscillator and includes first, second, third, and fourth transistors 322, 324, 362, and 364, first and second capacitors 326 and 328, a tail current source 366, and an inductor 314. The oscillator 396 receives a data input signal IN and modulates the data input signal IN based on On-Off keying (OOK) to generate first and second output signals $T_{xp}$ and $T_{xn}$. The CMTI circuit 330 is coupled to a first output node ON1 and a second output node ON2 of the transmitter 310. The CMTI circuit 330 receives the first output signal $T_{xp}$ and the second output signal $T_{xn}$ through the first output node ON1 and the second output node ON2, respectively.

The inductive isolator 312 includes a first winding 316 and a second winding 318. Parasitic capacitors Cp represent parasitic coupling between the inductor 314 of the transmitter 310 and the first winding 316 and between the second winding 318 and the inductor 320 of the receiver 360.

The receiver 360 receives data transferred across the inductive isolator 312 to generate a data output signal OUT in response to the received data. The receiver 360 is coupled to a second supply voltage (e.g., a high supply voltage) HVDD and a second ground voltage (e.g., a high ground voltage) VSSH.

When a common-mode transient event (e.g., an increase in the high ground voltage VSSH) occurs, a voltage across the parasitic capacitor Cp may be changed to cause a current Icp to flow into a corresponding one of the first and second output nodes ON1 and ON2. When the current Icp is injected into the oscillator 396, an oscillation amplitude of each of the first and second output signals $T_{xp}$ and $T_{xn}$ decreases until the oscillator 396 may substantially stop oscillation. The CMTI circuit 330 determines whether the oscillator 396 has stopped oscillation in response to the first and second output signals $T_{xp}$ and $T_{xn}$ and generates one or more activation signals BLDEN to resume the oscillation when it determines that the oscillator 396 has stopped the oscillation. The activation signals BLDEN adjusts a magnitude of a tail current $I_{tail}$ to resume the oscillation, thereby preventing an occurrence of a glitch in the data output signal OUT.

In an embodiment, the CMTI circuit 330 may include a plurality of bleeder circuits. For example, the CMTI circuit 330 may include a first bleeder circuit (e.g., a first bleeder circuit 432 in FIG. 4) and a second bleeder circuit (e.g., a second bleeder circuit 450 in FIG. 4) that generate a first activation signal (e.g., a first activation signal BLDEN1 in FIG. 4) and a second activation signal (a second activation signal BLDEN2 in FIG. 4), respectively. When the first bleeder circuit determines that the oscillator 396 has stopped the oscillation, the first bleeder circuit may generate the first activation signal to increase the magnitude of the tail current $I_{tail}$ by a first magnitude that is sufficient to resume the oscillation. When the increased magnitude of the tail current $I_{tail}$ by the first magnitude is not sufficient to keep the resumed oscillation, the second bleeder circuit may determine that the oscillator 396 has stopped the oscillation again and generate the second activation signal to further increase the magnitude of the tail current $I_{tail}$ by a second magnitude to resume and keep the oscillation.

Figure 4:
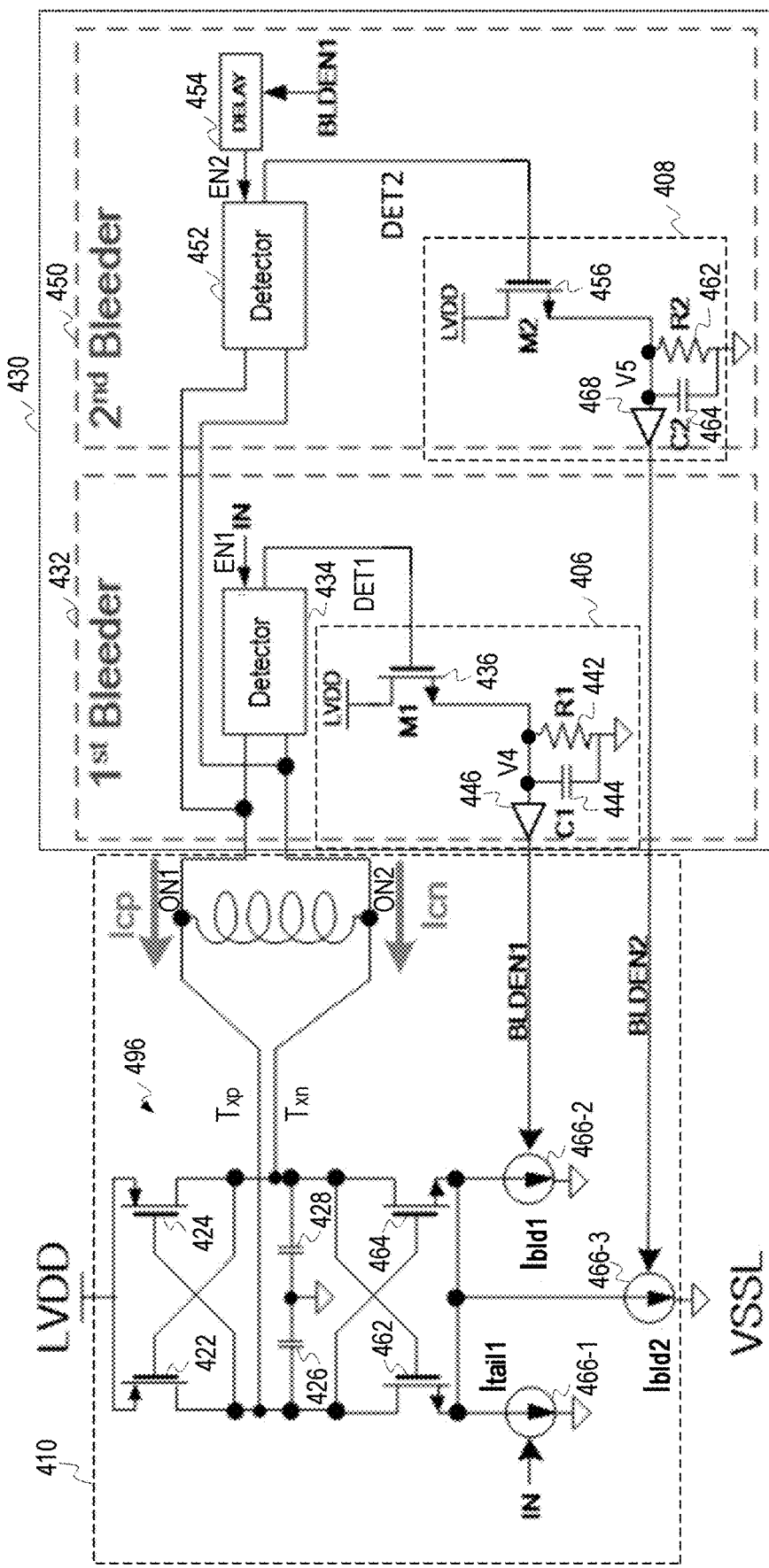
FIG. 4 illustrates a CMTI circuit according to an embodiment of the present disclosure.

FIG. 4 illustrates a CMTI circuit 430 suitable for use as the CMTI circuit 330 in FIG. 3 according to an embodiment of the present disclosure. The CMTI circuit 430 includes a first bleeder circuit 432 and a second bleeder circuit 450 and may increase a magnitude of a total tail current up to the sum of a first tail current $I_{tail}$, a second tail current $I_{bld1}$, and a third tail current $I_{bld2}$.

The first bleeder circuit 432 includes a first detector (e.g., a first common-mode transient (CMT) detector) 434 and a first activation signal generator 406. The first CMT detector 434 is coupled to a first output node ON1 and a second output node ON2 of the oscillator 496. The first CMT detector 434 receives the data input signal IN as a first enable signal EN1 and is activated in response to the first enable signal EN1.

The first activation signal generator 406 includes a first switching device 436, a first resistor 442, a first capacitor 444, and a first comparator 446. The first switching device 436 is coupled to the first CMT detector 434, a first supply voltage (e.g., a low supply voltage) LVDD, the first resistor 442, and the first capacitor 444. In an embodiment, the first switching device 436 is an NMOS transistor having a gate coupled to an output of the first CMT detector 434, a drain coupled to the low power supply LVDD, and a source coupled to a first end of the first resistor 442 and a first end of the first capacitor 444.

The first resistor 442 and the first capacitor 444 are coupled to each other in parallel. In an embodiment, a second end of the first resistor 442 and a second end of the first capacitor 444 are commonly coupled to a ground, and the first end of the first resistor 442 and the first end of the first capacitor 444 are commonly coupled to the first comparator 446.

The first comparator 446 compares a signal (e.g., a voltage) V4 at the first end of the first resistor 442 and the first end of the first capacitor 444 with a first reference voltage (not shown), and generates a first activation signal BLDEN1 in response to the comparison result. In an embodiment, the first comparator 446 generates the first activation signal BLDEN1 having a first logic value (e.g., a logic high value) during a given time interval when the voltage at the first end of the first resistor 442 and the first end of the first capacitor 444 is equal to or greater than the first reference voltage.

The first bleeder circuit 432 receive a first output signal $T_{xp}$, a second output signal $T_{xn}$, and the first enable signal EN1, determines whether a CMT event (e.g., a shift in the high ground voltage VSSH of FIG. 3) causes the oscillator 496 to substantially stop oscillation in response to the received signals $T_{xp}$, $T_{xn}$, and EN1, and generates the first activation signal BLDEN1 based on the determined result. For example, the first bleeder circuit 432 may determine that the oscillator 496 has substantially stopped oscillation in response to the first and second output signals $T_{xp}$ and $T_{xn}$ and the first enable signal EN1 to generate a first detection signal DET1, and generate the first activation signal BLDEN1 having a logic high value in response to the first detection signal DET1 when the first detection signal DET1 indicates that the oscillator 496 has substantially stopped oscillating. A second current source 466-2 generates the second tail current $I_{bld1}$ in response to the first activation signal BLDEN1 having a logic high value. Because the first current source 466-1 generates the first tail current $I_{tail1}$ in response to the data input signal IN and the second current source 466-2 generates the second tail current $I_{bld1}$ in response to the first activation signal BLDEN1, the magnitude of the total tail current of the oscillator 496 becomes equal to the sum of magnitudes of the first and second tail currents Lin and $I_{tail1}$ and the oscillator 496 may resume the oscillation.

Figure 5A:
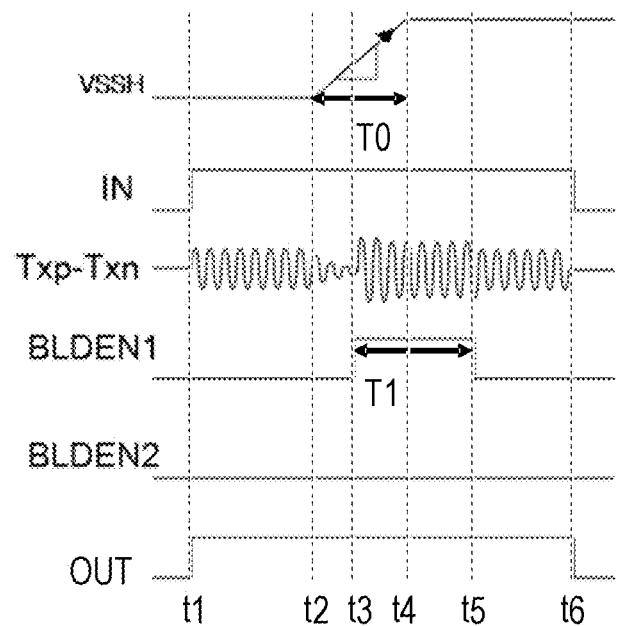
FIG. 5A illustrates an operation of a first bleeder circuit according to an embodiment of the present disclosure.

Hereinafter, an operation of the first bleeder circuit 432 will be described in more detail with reference to FIG. 5A. FIG. 5A illustrates an operation of the first bleeder circuit 432 when the low ground voltage VSSL increases with a relatively small slew rate during a relatively short time interval.

Referring to FIGS. 4 and 5A, at a first time $t_1$, the data input signal IN is asserted to transition from a first logic value (e.g., a logic low value) to a second logic value (e.g., a logic high value). The first current source 466-1 generates the first tail current $I_{tail1}$ in response to the data input signal IN, and the oscillator 496 begins oscillation for generating the first and second output signals $T_{xp}$ and $T_{xn}$. The first and second output signals $T_{xp}$ and $T_{xn}$ may be differential output signals, and a difference $T_{xp}-T_{xn}$ between the first and second output signals $T_{xp}$ and $T_{xn}$ oscillates as shown in FIG. 5A. In addition, the first CMT detector 434 is activated in response to the asserted data input signal IN and starts to determine whether the oscillator 496 substantially stops oscillation.

At a second time $t_2$, the high ground voltage VSSH starts to increase, and thus currents Icp may be injected into the oscillator 496 via the first output node ON1 and the second output node ON2. As a result, the magnitude of the difference $T_{xp}$-$T_{xn}$ between the first and second output signals $T_{xp}$ and $T_{xn}$ decreases until the oscillator 496 substantially stops oscillation.

At a third time $t_3$, the first CMT detector 434 generates the first detection signal DET1 having a specific value (e.g., a logic high value) when the received first and second output signals $T_{xp}$ and $T_{xn}$ are determined to be substantially not oscillating. For example, the first CMT detector 434 determines that the oscillator 496 has substantially stopped oscillation in response to the first and second output signals $T_{xp}$ and $T_{xn}$. In an embodiment, the first CMT detector 434 determines that the oscillator 496 substantially stops oscillation when one or both of the first output signal $T_{xp}$ and the second output signal $T_{xn}$ becomes substantially equal to the low power supply LVDD. For example, a difference between the low power supply LVDD and one or both of the first output signal $T_{xp}$ and the second output signal $T_{xn}$ may be equal to or less than 10%, 5%, 3%, or 1% of the low power supply LVDD. When the first CMT detector 434 determines that the oscillator 496 substantially stops oscillation, the first CMT detector 434 asserts the first detection signal DET1 to have a logic high value to turn on the first switching device 436.

The first capacitor 444 is charged when the first switching device 436 is turned on to couple the low power supply LVDD to an RC circuit including the first resistor 442 and the first capacitor 444, thereby increasing a voltage V4 at the first end of the first capacitor 444. Because the voltage V4 is greater than a reference value of the first comparator 446, the first comparator 446 asserts the first activation signal BLDEN1 to have a logic high value and outputs the asserted first activation signal BLDEN1 to the second current source 466-2. The second current source 466-2 generates the second tail current $I_{bld1}$ in response to the first activation signal BLDEN1, thereby increasing the magnitude of the total tail current of the oscillator 496 to the sum of the magnitude of the first tail current $I_{tail1}$ and the magnitude of the second tail current $I_{bld1}$. As a result, the oscillator 496 may resume the oscillation and keeps the resumed oscillation during a time interval between the third time $t_3$ to a fourth time $t_4$ when the high ground voltage VSSH keeps increasing to inject the currents Icp into the oscillator 496.

The first capacitor 444 is discharged when the first switching device 436 is turned off to decouple the low power supply LVDD from the RC circuit including the first resistor 442 and the first capacitor 444, thereby decreasing the voltage V4 at the first end of the first capacitor 444. The first comparator 446 keeps outputting the first activation signal BLDEN1 having a logic high value while the voltage V4 remains equal to or greater than the reference value.

At a fifth time $t_5$, the voltage V4 becomes less than the reference value, and thus the first comparator 446 de-asserts the first activation signal BLDEN1 to have a logic low value. The second current source 466-2 stops generating the second tail current $I_{bld1}$ in response to the first activation signal BLDEN1 having a logic low value, thereby reducing the magnitude of the total tail current of the oscillator 496 to that of the first tail current $I_{tail1}$. Because the high ground voltage VSSH has stopped from increasing since the fourth time $t_4$, the currents Icp are no longer generated to interrupt an operation of the oscillator 496. As a result, at the fifth time $t_5$, the oscillator 496 continues oscillation with the reduced magnitude of the total tail current.

A first time interval T1 between the third time $t_3$ to the fifth time $t_5$ when the first activation signal BLDEN1 has a logic high value may be determined based on an RC time constant of the RC circuit including the first resistor 442 and the first capacitor 444. In an embodiment, the first time interval T1 between the third time $t_3$ to the fifth time $t_5$ may be in a range of 80% to 95% of the RC time constant.

The first time interval T1 when the first activation signal BLDEN1 has a logic high value and the magnitude of the second tail current $I_{bld1}$ may be determined to ensure that the oscillator 496 resume oscillation under a number of conditions of the shift in the high ground voltage VSSH. For example, a slew rate in the high ground voltage VSSH may vary with a given peak voltage of the ground voltage VSSH. In an embodiment, the first time interval T1 may be equal to or longer than three times, five times, or ten times of a time interval T0 from the second time $t_2$ and the fourth time $t_4$ during which the low ground voltage VSSL increases.

In an embodiment, the magnitude of the second tail current $I_{bld1}$ may be determined such that the magnitude of the sum of the first tail current $I_{tail1}$ and the second tail current $I_{bld1}$ is sufficient to resume the oscillation under the number of conditions. For example, the magnitude of the second tail current $I_{bld1}$ may be in a range from two times to three times as great as the magnitude of the first tail current $I_{tail1}$.

At a sixth time $t_6$, the data input signal IN is de-asserted to transition from a logic high value to a logic low value. The first current source 466-1 stops generating the first tail current $I_{tail1}$ in response to the data input signal IN, and the oscillator 496 stops oscillation for generating the first and second output signals $T_{xp}$ and $T_{xn}$. As a result, the difference $T_{xp}$-$T_{xn}$ between the first and second output signals $T_{xp}$ and $T_{xn}$ stops oscillating as shown in FIG. 5A.

When the first CMT detector 434 determines that the oscillator 496 substantially stops oscillation in response to the first and second output signals $T_{xp}$ and $T_{xn}$, the first bleeder circuit 432 asserts the first activation signal BLDEN1 to increase the magnitude of the total tail current of the oscillator 496 by a first magnitude of the second current source 466-2. As a result, a time interval during which the difference $T_{xp}$-$T_{xn}$ between the first and second output signals $T_{xp}$ and $T_{xn}$ stops oscillating may be sufficiently short not to be seen by a receiver (e.g., the receiver 360 in FIG. 3). Accordingly, the receiver can generate a data output signal OUT without a glitch during the entire time interval from the first time $t_1$ and the sixth time $t_6$ when the data input signal IN has a logic high value.

Referring back to FIG. 4, the second bleeder circuit 450 includes a second CMT detector 452, a delay block (e.g., a delay circuit) 454, and a second activation signal generator 408. The second activation signal generator 408 includes a second switching device 456, a second resistor 462, a second capacitor 464, and a second comparator 468.

The second CMT detector 452 is coupled to the first output node ON1 and the second output node ON2 of the oscillator 496. The delay circuit 454 receives the first activation signal BLDEN1 from the first bleeder circuit 432, delays the received signal BLDEN1 by a given delay period, and outputs the delayed signal as a second enable signal EN2 to activate the second CMT detector 452.

The second switching device 456 is coupled to the second CMT detector 452, the low power supply LVDD, the second resistor 462, and the second capacitor 464. In an embodiment, the second switching device 456 is an NMOS transistor having a gate coupled to an output of the second CMT detector 452, a drain coupled to the low power supply LVDD, and a source coupled to a first end of the second resistor 462 and a first end of the second capacitor 464.

The second resistor 462 and the second capacitor 464 are coupled to each other in parallel. In an embodiment, a second end of the second resistor 462 and a second end of the second capacitor 464 are commonly coupled to a ground, and the first end of the second resistor 462 and the first end of the second capacitor 464 are commonly coupled to the second comparator 468.

The second comparator 468 compares a signal (e.g., a voltage) V5 at the first end of the second resistor 462 and the first end of the second capacitor 464 with a second reference voltage (not shown), and generates a second activation signal BLDEN2 in response to the comparison result. In an embodiment, the second comparator 468 generates the second activation signal BLDEN2 having a first logic value (e.g., a logic high value) during a given time interval when the voltage at the first end of the second resistor 462 and the first end of the second capacitor 464 is equal to or greater than the second reference voltage.

The second bleeder circuit 450 receives the first output signal $T_{xp}$, the second output signal $T_{xn}$, and the second enable signal EN2, determines whether a CMT event (e.g., a shift in a high ground voltage VSSH of FIG. 3) causes the oscillator 496 to substantially stop oscillating in response to the received signals $T_{xp}$, $T_{xn}$, and EN2, and generates the second activation signal BLDEN2 based on the determined result. For example, the second bleeder circuit 450 may delay the first activation signal BLDEN1 having a logic high value to generate the second enable signal EN2 having a logic high value, determine whether the oscillator 496 substantially stops oscillation in response to the first and second output signals $T_{xp}$ and $T_{xn}$ and the second enable signal EN2 to generate a second detection signal DET2, and generate the second activation signal BLDEN2 having a logic high value in response to the second detection signal DET2 to resume the oscillation when the second detection signal DET2 indicates that the oscillator 496 substantially stops the oscillation. A third current source 466-3 generates the third tail current $I_{bld2}$ in response to the second activation signal BLDEN2 having a logic high value. In an embodiment, the magnitude of the third tail current $I_{bld2}$ may be in a range from 80% to 120%, 90% to 110%, or 95% to 105% of that of the second tail current $I_{bld1}$. Because the first current source 466-1 generates the first tail current $I_{tail1}$ in response to the data input signal IN, the second current source 466-2 generates the second tail current $I_{bld1}$ in response to the first activation signal BLDEN1, and the third current source 466-3 generates the third tail current $I_{bld2}$ in response to the second activation signal BLDEN2, the magnitude of the total tail current of the oscillator 496 becomes equal to the sum of magnitudes of the first, second, and third tail currents $I_{tail1}$, $I_{bld1}$, and $I_{bld2}$, and the oscillator 496 may begin oscillating again.

Figure 5B:
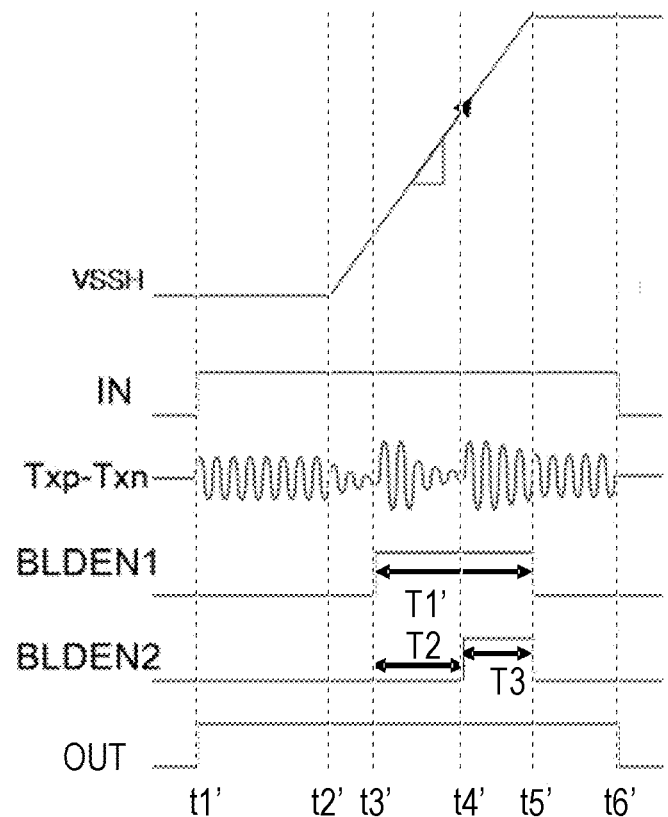
FIG. 5B illustrates an operation of the first bleeder circuit and a second bleeder circuit according to an embodiment of the present disclosure.

Hereinafter, an operation of the first bleeder circuit 432 and the second bleeder circuit 450 will be described in more detail with reference to FIG. 5B. FIG. 5B differs from FIG. 5A in that FIG. 5B illustrates an operation of the first and second bleeder circuits 432 and 450 when the high ground voltage VSSH increases with a relatively high slew rate (e.g., greater than 100 V/ns) during a relatively long time interval (e.g., longer than 15 ns). Descriptions on some operations of the CMTI circuit 430 with reference to FIG. 5B are similar to those described above with reference to FIG. 5A, and thus these similar descriptions may be omitted for the interest of brevity.

At a third time $t_3'$, the first bleeder circuit 432 determines that the oscillator 496 substantially has stopped oscillation in response to the first and second output signals $T_{xp}$ and $T_{xn}$ and asserts the first activation signal BLDEN1 to have a logic high value to activate the second current source 466-2. The magnitude of the total tail current of the oscillator 496 increases to the sum of the magnitude of the first tail current $I_{tail1}$ and the magnitude of the second tail current $I_{bld1}$, and thus the oscillator 496 may resume oscillation. However, the increased magnitude of the total tail current of the oscillator 496 may not be sufficient to keep the resumed oscillation and the oscillator 496 may substantially stop the oscillation again at a fourth time $t_4'$.

At the fourth time $t_4'$, the delay circuit 454 asserts the second enable signal EN2 to have a logic high value a second time interval T2 after the first activation signal BLDEN1 is asserted at the third time $t_3'$. The second CMT detector 452 is activated in response to the second enable signal EN2, and generates the second detection signal having a specific value (e.g., a logic high value) when the first and second output signals $T_{xp}$ and $T_{xn}$ are determined to be substantially not oscillating. For example, the second CMT detector 452 determines whether the oscillator 496 has substantially stopped oscillation in response to the first and second output signals $T_{xp}$ and $T_{xn}$. When the second CMT detector 452 determines that the oscillator 496 has substantially stopped the oscillation, the second CMT detector 452 asserts the second detection signal DET2 to have a logic high value to turn on the second switching device 456. The second capacitor 464 is charged when the second switching device 456 is turned on to couple the low power supply LVDD to an RC circuit including the second resistor 462 and the second capacitor 464, thereby increasing the voltage V5 at the first end of the second capacitor 464. As a result, the second comparator 468 asserts the second activation signal BLDEN2 to have a logic high value and outputs the asserted second activation signal BLDEN2 to the third current source 466-3. The third current source 466-3 generates the third tail current $I_{bld2}$ in response to the second activation signal BLDEN2, thereby increasing the magnitude of the total tail current of the oscillator 496 to the sum of the magnitudes of the first, second, and third tail currents $I_{tail1}$, $I_{bld1}$, and $I_{bld2}$. As a result, the oscillator 496 may resume oscillation.

At a fifth time $t_5'$, the first bleeder circuit 432 de-asserts the first activation signal BLDEN1 to have a logic low value, and the second bleeder circuit 450 de-asserts the second activation signal BLDEN2. The second current source 466-2 stops generating the second tail current $I_{bld1}$ in response to the first activation signal BLDEN1 and the third current source 466-3 stops generating the third tail current $I_{bld2}$ in response to the second activation signal BLDEN2, thereby reducing the magnitude of the total tail current of the oscillator 496 to that of the first tail current $I_{tail1}$. Because the low ground voltage VSSL has stopped from increasing at or before the fifth time $t_5'$, the currents Icp are no longer generated to interrupt an operation of the oscillator 496. As a result, after the fifth time $t_5'$, the oscillator 496 continues oscillation with the reduced magnitude of the total tail current.

A third time interval T3 between the fourth time $t_4'$ and the fifth time $t_5'$ when the second activation signal BLDEN2 has a logic high value may be determined based on an RC time constant of the RC circuit including the second resistor 462 and the second capacitor 464. In an embodiment, the third time interval T3 between the fourth time $t_4'$ and the fifth time $t_5'$ may be sufficient to make the second time interval T2 long enough to prevent the third current source 466-3 from operating to generate the third tail current $I_{bld2}$ when the magnitude of the second tail current $I_{bld1}$ generated by the second current source 466-2 is sufficiently great to resume and keep the oscillation, thereby minimizing power consumption. In an embodiment, the third time interval T3 may be in a range from 10% to 50%, from 20% to 40%, or from 25% to 35% of the first time interval T1' during which the first activation signal BLDEN1 has a logic high value.

As described above with reference to FIG. 5B, when the high ground voltage VSSH increases with a relatively large slew rate during a relatively long time interval, the increased magnitude of the total tail current of the oscillator 496 using the first bleeder circuit 432 may not be sufficient to keep the resumed oscillation of the oscillator 496. When the oscillator 496 substantially stops the oscillation again, the CMTI circuit 430 according to the embodiment shown in FIG. 4 further increases the total amount of the total tail current of the oscillator 496 using the second bleeder circuit 450 to resume and keep the oscillation, thereby preventing an occurrence of a glitch in the data output signal OUT from the receiver. Accordingly, a transceiver including the CMTI circuit 430 according to an embodiment of the present disclosure may have robust CMTI characteristics to withstand one or more of a high peak voltage, a high maximum voltage slew rate, and a long time interval of a shift in the high ground voltage VSSH.

When the high ground voltage VSSH increases with a relatively small slew rate during a relatively short time interval as described above with reference to FIG. 5A, the increased magnitude of the total tail current of the oscillator 496 using the first bleeder circuit 432 may be sufficient to keep the resumed oscillation of the oscillator 496, and thus the second bleeder circuit 450 may not operate. When the CMTI circuit 430 needs to operate the first and second bleeder circuits 432 and 450 as described above with reference to FIG. 5B, the CMTI circuit 430 operates the second bleeder circuit 450 at the fourth time $t_4$' after the third time $t_3$' at which the CMTI circuit 430 starts to operate the first bleeder circuit 432, thereby operating the second bleeder circuit 450 during the third time interval T3 shorter than the first time interval T1' during which the first bleeder circuit 432 operates. Accordingly, a transceiver including the CMTI circuit 430 according to an embodiment of the present disclosure may minimize usage of the second bleeder circuit 450 to reduce power consumption.

In addition, the CMTI circuit 430 prevents an occurrence of a glitch in the data output signal OUT from the receiver using the first bleeder circuit 432 and the second bleeder circuit 450, rather than using a delay filter to remove a glitch in the data output signal OUT. Accordingly, a transceiver including the CMTI circuit 430 according to an embodiment of the present disclosure may reduce a propagation delay compared to a conventional transceiver including the delay filter, thereby increasing a data transfer rate.

Figure 6:
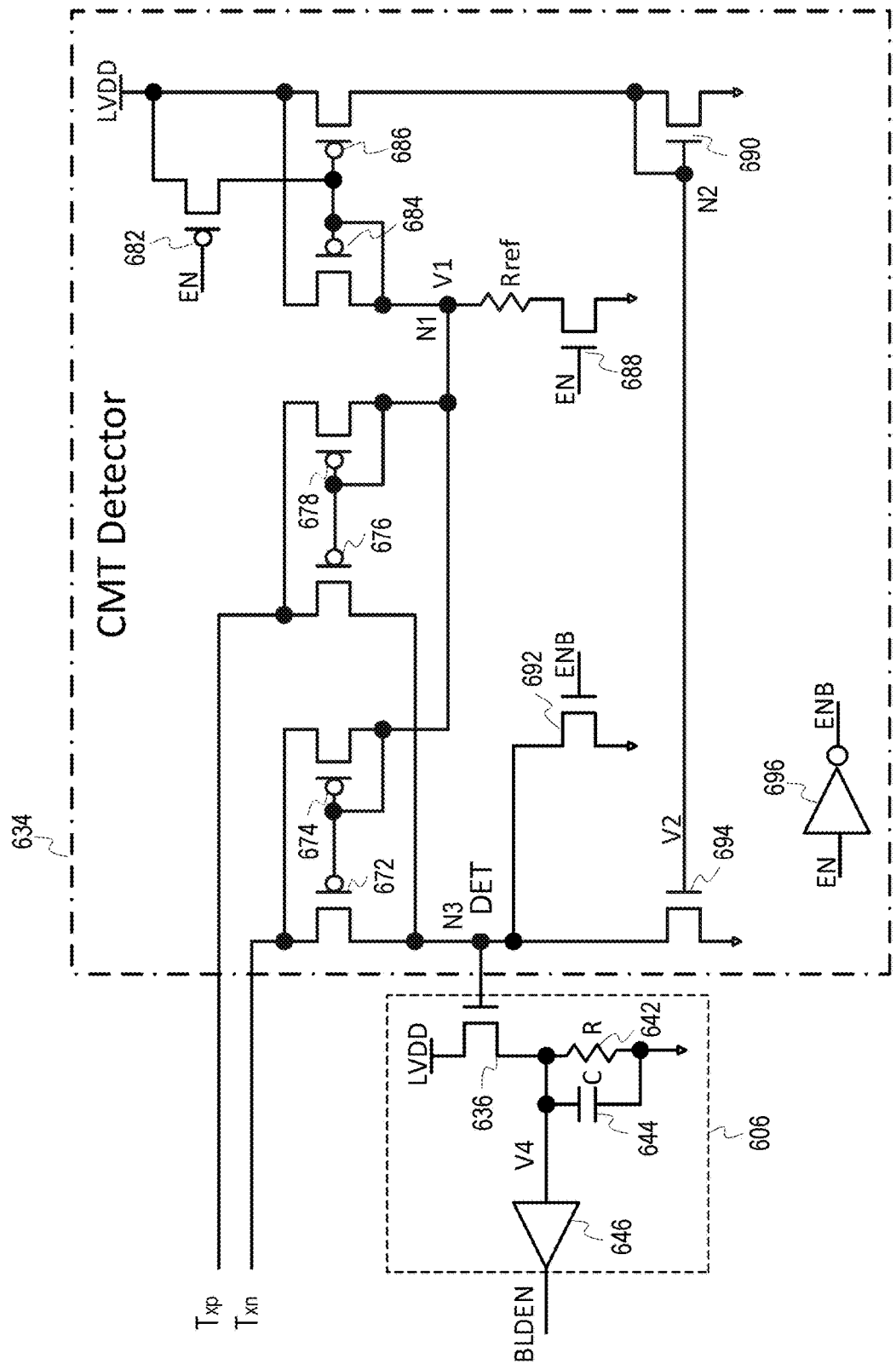
FIG. 6 illustrates a common-mode transient (CMT) detector according to an embodiment of the present disclosure.

FIG. 6 illustrates a detector (e.g., a CMT detector) 634 according to an embodiment. In an embodiment, the CMT detector 634 may be suitable for use as the first CMT detector 434 of FIG. 4, or the second CMT detector 452 of FIG. 4, or both.

Figure 7:
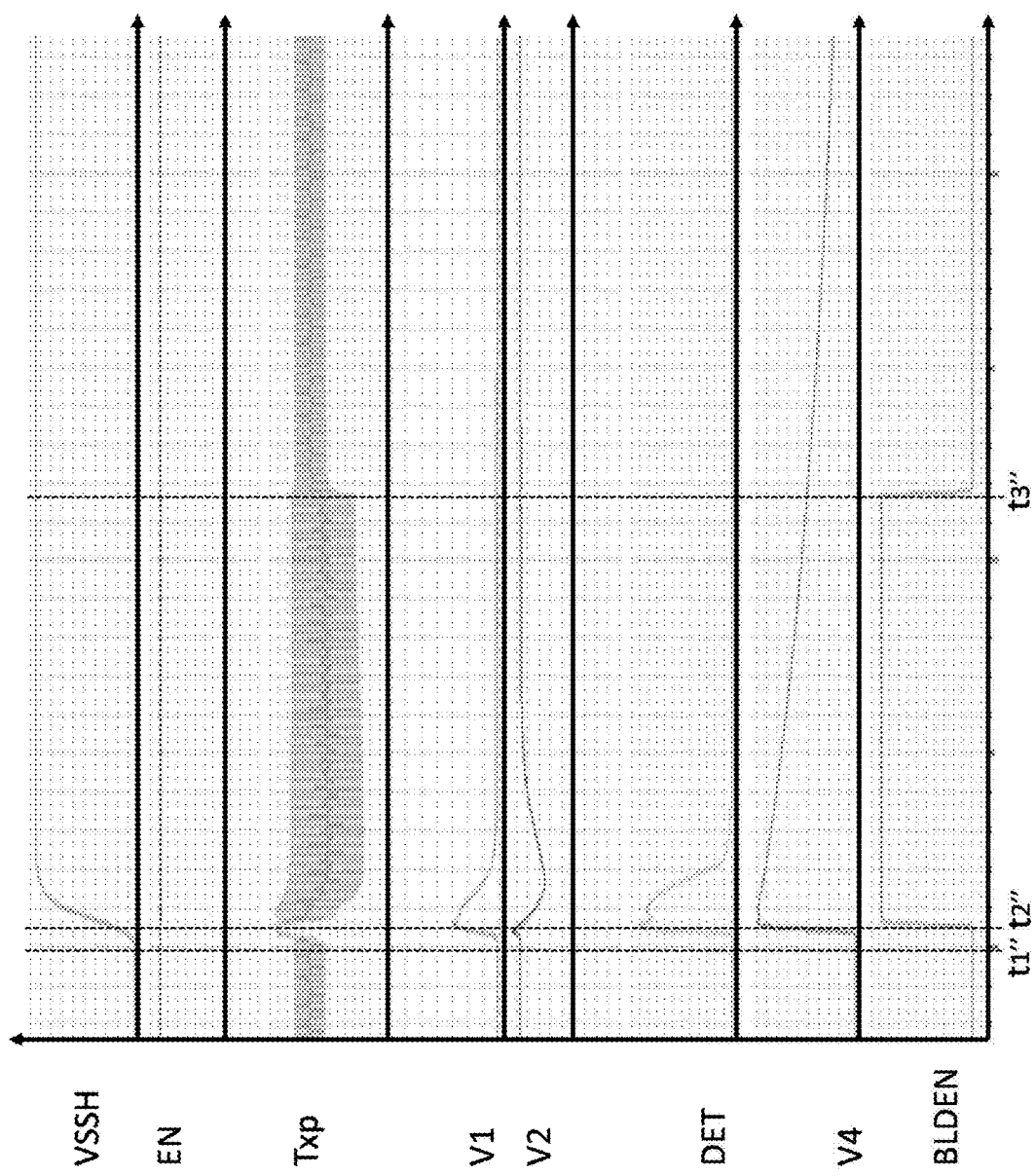
FIG. 7 illustrates an operation of the CMT detector in FIG. 6 according to an embodiment of the present disclosure.

The CMT detector 634 receives a first output signal $T_{xp}$ and a second output signal $T_{xn}$ from an oscillator (e.g., the oscillator 496 in FIG. 4) and an enable signal EN, determines whether a CMT event (e.g., a shift in a high ground voltage VSSH) causes the oscillator to substantially stop oscillating in response to the received signals $T_{xp}$, $T_{xn}$, and EN, and generates an activation signal BLDEN based on the determined result. Hereinafter, an operation of the CMT detector 634 will be described below in more detail with reference to FIG. 7.

Before a first time $t_1$", the enable signal EN is asserted to transition from a first logic value (e.g., a logic low value) to a second logic value (e.g., a logic high value), thereby activating the CMT detector 634. For example, the enable signal EN may correspond to the first enable signal EN1 for activating the first CMT detector 434 in FIG. 4, or the enable signal EN may correspond to the second enable signal EN2 for activating the second CMT detector 452, or both.

At the first time $t_1$", a ground voltage (e.g., the high ground voltage VSSH in FIG. 3) starts to increase, and thus currents (e.g., the currents Icp in FIG. 3) may be injected into the oscillator. As a result, an oscillation amplitude of each of the first and second output signals $T_{xp}$ and $T_{xn}$ is reduced until the oscillator substantially stops oscillation at a second time $t_2$".

At the second time $t_2$", each of the first and second output signals $T_{xp}$ and $T_{xn}$ becomes substantially equal to a power supply (e.g., the low power supply LVDD in FIG. 4). When each of the first and second output signals $T_{xp}$ and $T_{xn}$ reaches the low power supply LVDD, a first PMOS transistor 674 has a source receiving the second output signal $T_{xn}$ and a second PMOS transistor 678 has a source receiving the first output signal $T_{xp}$. As a result, a current flowing through each of the first and second PMOS transistors 674 and 678 is increased, thereby increasing a first voltage V1 at a first node N1 commonly coupled to a drain of the first PMOS transistor 674 and a drain of the second PMS transistor 678.

When the first voltage V1 is increased, the first node N1 is coupled to a drain and a gate of a third PMOS transistor 684, and thus a current flowing through the third PMOS transistor 684 is decreased. The third PMOS transistor 684 and a fourth PMOS transistor 686 function as a current mirror, and thus a current flowing through the fourth PMOS transistor 686 is also decreased. When the current flowing through the fourth PMOS transistor 686 is decreased, a second voltage V2 at a second node N2 coupled to a gate of a first NMOS transistor 690 is decreased.

When the second voltage V2 at the second node N2 is decreased, a current flowing through a second NMOS transistor 694 decreases, thereby decreasing the current flowing out of a third node N3. Meanwhile, a fifth PMOS transistor 672 has a source receiving the second output signal $T_{xn}$ and a sixth PMOS transistor 676 has a source receiving the first output signal $T_{xp}$. As a result, a current flowing through each of the fifth and sixth PMOS transistors 672 and 676 is increased, thereby increasing a current flowing into the third node N3. When the current flowing out of the third node N3 decreases and the current flowing into the third node N3 increases, a value of a detection signal (e.g., a detection voltage) DET at the third node N3 increases at a relatively rapid rate. In other words, assuming that the second NMOS transistor 694 and the fifth and sixth PMOS transistors 672 and 676 implement an inverter, the second NMOS transistor 694 would receive the second voltage V2 as an input signal and the fifth and sixth PMOS transistors 672 and 676 together would functions as a load of the inverter. Because the inverter has a relatively high gain due to the reduced resistance of the load, the inverter generates the detection voltage DET having a relatively large value as an output signal in response to the decreased second voltage V2.

When the CMT detector 634 outputs the detection voltage DET to a control terminal (e.g., a gate) of a switching device (e.g., an NMOS transistor) 636, the low power supply LVDD is coupled to an RC circuit including a resistor 642 and a capacitor 644, thereby increasing a voltage V4 at the first end of the capacitor 644. As a result, a comparator 646 asserts the activation signal BLDEN to have a logic high value and outputs the asserted activation signal BLDEN. Subsequently, the capacitor 644 is discharged when the switching device 636 is turned off to decouple the low power supply LVDD from the RC circuit including the resistor 642 and the capacitor 644, thereby decreasing the voltage V4 at the first end of the capacitor 644.

At a third time $t_3"$, the voltage V4 becomes less than a reference value, and thus the comparator 646 de-asserts the activation signal BLDEN to have a logic low value. In an embodiment, a time interval between the second time $t_2"$ to the third time $t_3"$ may be in a range of 80% to 95% of an RC time constant of the RC circuit.

Figure 8:
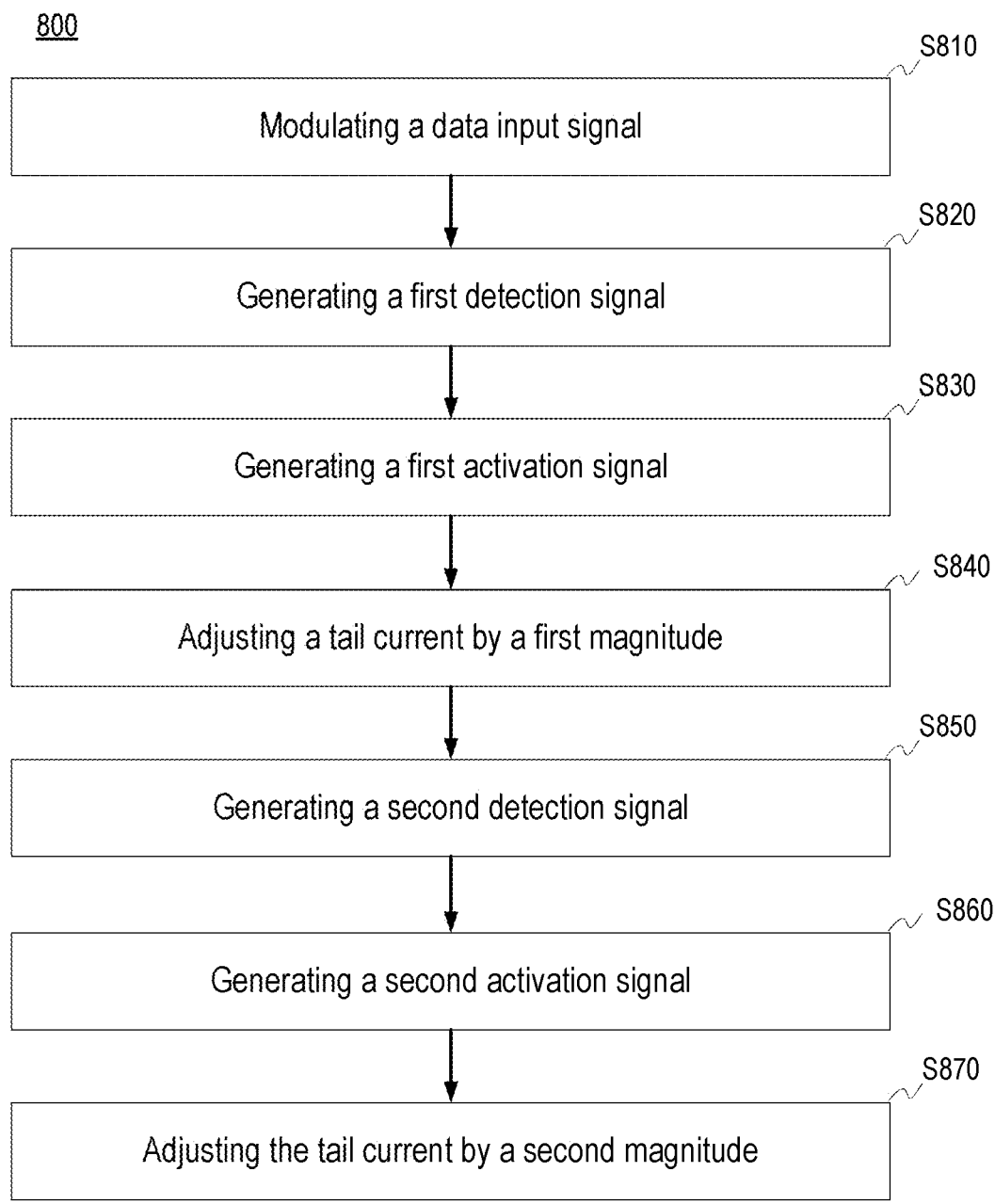
FIG. 8 illustrates a process performed by a system according to an embodiment of the present disclosure.

FIG. 8 illustrates a process 800 performed by a system (e.g., the system 300 in FIG. 3) according to an embodiment. In an embodiment, the system includes a transmitter (e.g., the transmitter 310 in FIG. 3), a galvanic isolator (e.g., the inductive galvanic isolator 312 in FIG. 3), and a receiver (e.g., the receiver 360 in FIG. 3).

At S810, the receiver modulates a data input signal (e.g., the data input signal IN in FIG. 3) using an oscillator (e.g., the oscillator 396 in FIG. 3) to generate one or more output signals (e.g., the first and second output signals $T_{xp}$ and $T_x$ in FIG. 3). In an embodiment, the transmitter modulates the data input signal based on On-Off keying (OOK) to generate the first and second output signals $T_{xp}$ and $T_{xn}$.

At S820, a first bleeder circuit (e.g., the first bleeder circuit 432 in FIG. 4) generates a first detection signal (e.g., the first detection signal DET1 in FIG. 4) having a specific value (e.g., a logic high value) in response to the received output signals and a first enable signal (e.g., the first enable signal EN1 in FIG. 4) when the output signals are determined to be substantially not oscillating at a first time (e.g., the third time $t_3'$ in FIG. 5B). In an embodiment, the first enable signal is the data input signal.

At S830, the first bleeder circuit generates a first activation signal (e.g., the first activation signal BLDEN1 in FIG. 4) in response to the first detection signal to resume oscillation of the output signals when the first detection signal indicates that the output signals are substantially not oscillating. In an embodiment, the first bleeder circuit includes an RC circuit and the first activation signal has a specific value (e.g., a logic high value) during a time interval (e.g., the first time interval T1' in FIG. 5B) that is determined based on an RC time constant of the RC circuit.

At S840, the oscillator adjusts a magnitude of a tail current by a first magnitude in response to the first activation signal when the first detection signal indicates that the output signals are substantially not oscillating at the first time. In an embodiment, the oscillator includes a first current source (e.g., the first current source 466-1 in FIG. 4) generating a first tail current (e.g., the first tail current $I_{tail}$ in FIG. 0.4) and a second current source (e.g., the second current source 466-2 in FIG. 4) that generates a second tail current (e.g., the second tail current $I_{bld1}$ in FIG. 4) having the first magnitude.

At S850, a second bleeder circuit (e.g., the second bleeder circuit 450 in FIG. 4) generates a second detection signal (e.g., the second detection signal DET2 in FIG. 4) having a specific value (e.g., a logic high value) in response to the received output signals and a second enable signal (e.g., the second enable signal EN2 in FIG. 4) when the output signals are substantially not oscillating at a second time (e.g., the fourth time $t_4'$ in FIG. 5B). In an embodiment, the second bleeder circuit includes a delay circuit (e.g., the delay circuit 454 in FIG. 4) to delay the first activation signal to generate the second enable signal.

At S860, the second bleeder circuit generates a second activation signal (e.g., the second activation signal BLDEN2 in FIG. 4) in response to the second detection signal to resume the oscillation when the second detection signal indicates that the output signals are substantially not oscillating. In an embodiment, the second bleeder circuit includes an RC circuit and the second activation signal has a specific logic value (e.g., a logic high value) during a time interval (e.g., the third first time interval T3 in FIG. 5B) that is determined based on an RC time constant of the RC circuit.

At S870, the oscillator adjusts the magnitude of the tail current by a second magnitude in response to the second activation signal when the second detection signal indicates that the output signals are substantially not oscillating at the second time. In an embodiment, the oscillator further includes a third current source (e.g., the third current source 466-3 in FIG. 4) that generates a third tail current (e.g., the third tail current $I_{bld2}$ in FIG. 4) having the second magnitude.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A common-mode transient immunity (CMTI) circuit, comprising:
a first detector configured to receive at least one output signal from an oscillator and a first enable signal and generate a first detection signal when the at least one output signal is determined to be substantially not oscillating at a first time; and
a first activation signal generator configured to generate a first activation signal in response to the first detection signal to resume oscillation of the at least one output signal.

2. The CMTI circuit of claim 1, wherein the first activation signal generator generates the first activation signal having a first value to adjust a magnitude of a tail current of the oscillator by a first magnitude.

3. The CMTI circuit of claim 2, further comprising:
a second detector configured to receive the at least one output signal and a second enable signal and generate a second detection signal when the at least one output signal is determined to be substantially not oscillating at a second time; and
a second activation signal generator configured to generate a second activation signal in response to the second detection signal to resume the oscillation.

4. The CMTI circuit of claim 3, wherein the second activation signal generator generates the second activation signal having a second value to adjust the magnitude of the tail current of the oscillator by a second magnitude.

5. The CMTI circuit of claim 4, wherein the first activation signal has the first value during a first time interval and the second activation signal has the second value during a second time interval, the second time interval being in a range of 10% to 50% of the first time interval.

6. The CMTI circuit of claim 4, wherein the first activation signal generator includes:

a first switching device having a control terminal that receives the first detection signal and a first terminal coupled to a power supply voltage;

a first RC circuit coupled to a second terminal of the first switching device and including a first resistor and a first capacitor coupled in parallel; and a first comparator coupled to the first RC circuit and generating the first activation signal, wherein the first value and the second value are a same logic value.

7. The CMTI circuit of claim 6, wherein the second activation signal generator includes:

a second switching device having a control terminal that receives the second detection signal and a first terminal coupled to the power supply voltage;

a second RC circuit coupled to a second terminal of the second switching device and including a second resistor and a second capacitor coupled in parallel; and a second comparator coupled to the second RC circuit and generating the second activation signal.

8. The CMTI circuit of claim 4, wherein the first activation signal generator increases the magnitude of the tail current of the oscillator by the first magnitude and the second activation signal generator increases the magnitude of the tail current of the oscillator by the second magnitude, the second magnitude being in a range of 80% to 120% of the first magnitude.

9. The CMTI circuit of claim 3, further comprising a delay circuit configured to delay the first activation signal to generate the second enable signal.

10. The CMTI circuit of claim 1, wherein the at least one output signal includes a first output signal and a second output signal, and the first detector determines that the oscillator has substantially stopped the oscillation when one or both of the first output signal and the second output signal become substantially equal to a power supply voltage coupled to the oscillator.

11. A system, comprising:

a transmitter configured to modulate a data input signal using an oscillator to generate at least one output signal, the transmitter including a first bleeder circuit configured to generate a first detection signal in response to a first enable signal when the at least one output signal is determined to be substantially not oscillating at a first time and generate a first activation signal in response to the first detection signal to resume oscillation of the at least one output signal;

a galvanic isolator configured to transfer the at least one output signal from the transmitter; and a receiver configured to generate a data output signal in response to the transferred at least one output signal.

12. The system of claim 11, wherein the oscillator includes a first current source configured to generate a first tail current in response to the data input signal and a second current source configured to generate a second tail current in response to the first activation signal.

13. The system of claim 12, wherein the transmitter further includes a second bleeder circuit configured to:

delay the first activation signal to generate a second enable signal;

generate a second detection signal in response to the second enable signal when the at least one output signal is determined to be substantially not oscillating at a second time; and generate a second activation signal in response to the second detection signal to resume the oscillation.

14. The system of claim 13, wherein the oscillator further includes a third current source configured to generate a third tail current in response to the second activation signal.

15. The system of claim 11, wherein:

the transmitter further includes a first inductor, the galvanic isolator includes a first winding and a second winding, and the receiver includes a second inductor, and the transmitter and the first winding of the galvanic isolator are integrated in a first chip and the receiver and the second winding of the galvanic isolator is integrated in a second chip.

16. The system of claim 11, wherein the at least one output signal includes a first output signal and a second output signal, and the first bleeder circuit determines that the oscillator has substantially stopped the oscillation when one or both of the first output signal and the second output signal become substantially equal to a power supply voltage coupled to the oscillator.

17. A method for controlling data transfer, the method comprising:

modulating a data input signal using an oscillator to generate at least one output signal;

generating a first detection signal in response to a first enable signal when the at least one output signal is determined to be substantially not oscillating at a first time; and generating a first activation signal in response to the first detection signal to resume oscillation of the at least one output signal.

18. The method of claim 17, further comprising adjusting a magnitude of a tail current by a first magnitude in response to the first activation signal when the first detection signal indicates that the at least one output signal is substantially not oscillating at the first time.

19. The method of claim 18, further comprising:

delaying the first activation signal to generate a second enable signal;

generating a second detection signal in response to the second enable signal when the at least one output signal is substantially not oscillating at a second time; and generating a second activation signal in response to the second detection signal to resume the oscillation.

20. The method of claim 19, further comprising adjusting the magnitude of the tail current by a second magnitude in response to the second activation signal when the second detection signal indicates that the at least one output signal is substantially not oscillating at the second time.

* * * * *